United States Patent [19]

Ozaki et al.

[11] Patent Number: 5,084,416
[45] Date of Patent: Jan. 28, 1992

[54] METHOD OF FORMING A LOW RESISTANCE CONTACT BY FORMING A CONTACT HOLE WITHIN A RECESS

[75] Inventors: Hideto Ozaki; Shuichi Mayumi, both of Kyoto; Seiji Ueda, Otsu, all of Japan

[73] Assignee: Matsushita Electronics Corporation, Osaka, Japan

[21] Appl. No.: 481,561

[22] Filed: Feb. 20, 1990

[30] Foreign Application Priority Data

Feb. 17, 1989 [JP] Japan .................................. 1-38638

[51] Int. Cl.⁵ ............................................. H01L 21/44
[52] U.S. Cl. ...................................... 437/190; 437/193; 437/195; 437/200; 437/225; 437/231
[58] Field of Search ............... 437/190, 193, 195, 200, 437/231, 225

[56] References Cited

U.S. PATENT DOCUMENTS

| | | | |
|---|---|---|---|
| 3,922,184 | 11/1975 | Baker et al. | 437/228 |
| 4,502,209 | 3/1985 | Eizenberg et al. | 437/200 |
| 4,729,965 | 3/1988 | Tamaki et al. | 437/200 |
| 4,879,254 | 11/1989 | Tsuzuki et al. | 437/41 |
| 4,906,592 | 3/1990 | Merenda et al. | 437/195 |
| 4,981,809 | 1/1991 | Mitsuaki et al. | 437/41 |

FOREIGN PATENT DOCUMENTS

| | | | |
|---|---|---|---|
| 0008928 | 3/1980 | European Pat. Off. | 437/203 |
| 56-17040 | 2/1981 | Japan | 437/195 |
| 59-104125 | 6/1984 | Japan | 437/234 |
| 59-184548 | 10/1984 | Japan | 437/235 |

*Primary Examiner*—Brian E. Hearn
*Assistant Examiner*—Laura M. Holtzman
*Attorney, Agent, or Firm*—Wenderoth, Lind & Ponack

[57] ABSTRACT

The invention is intended to form a recess large in the opening width at the contact hole forming position of the insulator film before opening contact holes in the insulator film, and to open contact holes smaller in opening width at the bottom of the recess.

According to the manufacturing method of the invention, since the opening size of the recess in the upper portion of the contact hole may be set larger and by decreasing the shadowing effect when covering the aluminum alloy wiring layer, the degree of covering of the aluminum alloy wiring layer on the side wall of the contact hole is improved, so that reduction of contact resistance and enhancement of reliability may be achieved. Besides, since the bottom of the contact hole may be opened at high precision, mutual fine connection of wiring layers is possible, and even if the elements are integrated at high density, a proper clearance may be maintained between the contact hole and gate electrode, and thereby electrical leak between wiring layers may be effectively prevented.

14 Claims, 8 Drawing Sheets

FIG. I(i)
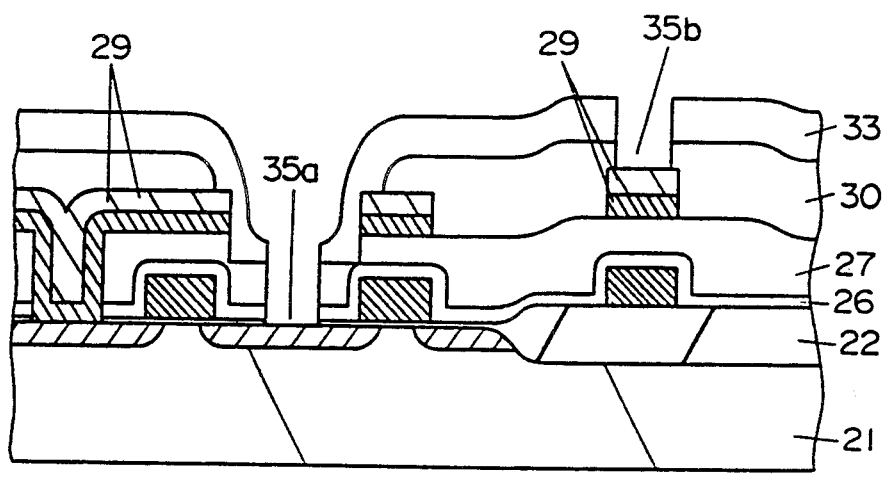
FIG. I(j)
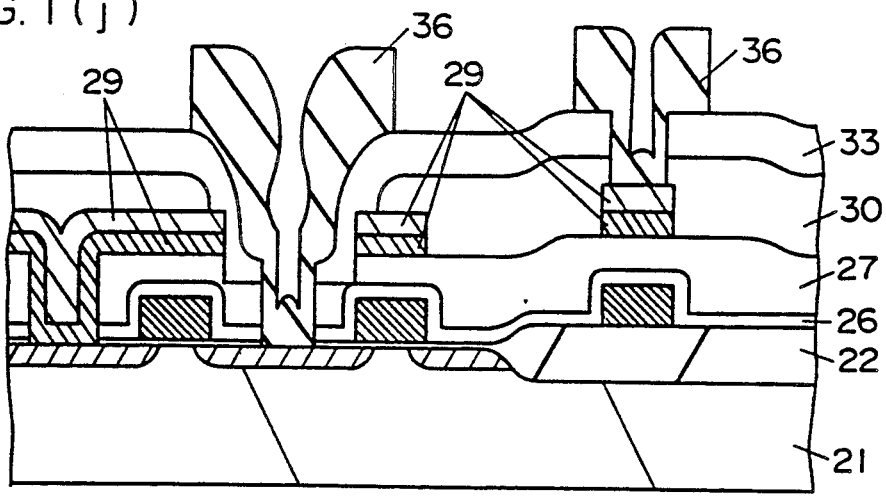

METHOD OF FORMING A LOW RESISTANCE CONTACT BY FORMING A CONTACT HOLE WITHIN A RECESS

BACKGROUND OF THE INVENTION

The present invention relates to a method of manufacturing a semiconductor device having fine contacts.

In recent semiconductor devices, as the element density and degree of integration, increase the wirings and contact portions are becoming finer and finer. The conventional method of forming a contact structure is described in detail below while referring to the process sectional views shown in FIGS. 5(a) to (f).

First, employing a known technology on one principal plane of a silicon substrate 1, a selective oxidation (LOCOS) film 2 for separation of elements is formed in a specified region at a thickness of about 500 nm. Consequently, a gate oxide film 3 of 20 nm in thickness is formed on the principal plane of the silicon substrate 1. Next, a polycrystalline silicon gate layer 4a of 300 to 500 nm in thickness and polycrystalline silicon wiring layer 4b are formed on the gate oxide film 3 and the oxidation film 2 respectively. Afterwards using the polycrystalline silicon gate layer 4a as a mask, ions are implanted to form a diffusion region (diffusion region wiring) 5, and ions are activated by annealing, thereby forming a MOS type semiconductor device. In succession, an oxide film 6 of about 300 nm in thickness is deposited on the entire area of the substrate surface [FIG. 5(a)]. The oxide film 6 is generally formed by the chemical vapor deposition (CVD) method.

On the oxide film 6, a BPSG film 7 of 400 nm in thickness is deposited by using CVD. The BPSG film 7 has impurity concentrations of, for example, 3 wt. % of boron (B) and 5 wt. % of phosphorus (P), approximately.

In a nitrogen atmosphere subsequently, heat treatment is applied for 60 minutes at 900° C. to cause the BPSG film 7 to flow in order to lessen the step difference of the surface of the BPSG film [FIG. 5(b)]. At this time, the oxide film 6 prevents thermal diffusion of phosphorus (P) and boron (B) from the BPSG film 7 to the silicon substrate 1.

On the BPSG film 7, a photoresist (not shown) is applied, a specified resist pattern is formed by photoetching, and using this resist pattern as a mask, the oxide film 6 and BPSG film 7 are removed by etching, thereby forming a contact hole 8. Furthermore, the resist pattern is removed [FIG. 5(c)].

Then, a polycide wiring layer 9 is formed on the BPSG film 7 and in the contact hole 8 [FIG. 5(d)]. This polycide wiring layer 9 is composed of two layers, that is, a lower layer of a 200 nm thick polycrystalline silicon film 9a and the upper layer of a 200 nm thick tungsten silicide (WiSix) film 9b. Since phosphorus is to be introduced into the polycrystalline silicon film 9a, it is heat-treated in a nitrogen atmosphere containing a phosphorus compound, and the tungsten silicide film 9b is deposited by using CVD. This polycide wiring layer 9 is patterned by anisotropic etching, such as RIE.

This polycide wiring layer 9 has a lower wiring resistance than the single layer of polycrystalline silicon, so that the circuit delay due to the wiring resistance may be improved.

Then, on the entire area of the substrate surface, as shown in FIG. 5(e), a BPSG film 10 is deposited at a thickness of 500 nm. The BPSG film 10 has impurity concentrations of, for example, 3 wt. % of boron (B) and 5 wt. % of phosphorus (P), approximately.

Afterwards, in a nitrogen atmosphere, heat treatment is performed for 60 minutes at 900° C. to flow cause the BPSG film 10 to flow, thereby lessening the step difference due to the polycrystalline silicon gate layer 4a, 4b and the polycide wiring layer 9.

Then, on the BPSG film 10, a photoresist (not shown) is applied, and a specified resist pattern is formed by photoetching. In consequence, using the resist pattern as the a mask, the oxide film 6 and BPSG films 7, 10 are removed by RIE etching, and thereby, contact holes 11 are formed [FIG. 5(e)]. Then, the resist pattern is removed.

Next, a wiring layer 12 of an aluminum alloy is formed. The aluminum alloy wiring layer 12 is deposited at a film thickness of 0.8 μm by a known method such as sputtering, and is patterned by anisotropic etching such as RIE etching [FIG. 5(f)].

After these steps, the semiconductor device of the prior art is nearly complete.

However, when the contact holes 11 must be formed in a fine pattern, the aspect ratio (hole depth/hole width) of the contact holes 11 becomes high, exceeding 1. As a result, the portion of the aluminum alloy film 12 formed on the side wall of the contact hole 11 becomes thin, and the resistance of the aluminum alloy film 12 may increase, the reliability of the aluminum alloy film 12 may be lessened (for example, electromigration may be likely to occur) and other defects may take place. Thus, in the conventional method of manufacturing a semiconductor device, when a contact hole of a high aspect ratio is formed in a fine pattern, it becomes difficult to bury an aluminum alloy film securely in the contact hole.

It is hence a primary object of the invention to present a method of manufacturing a semiconductor device capable of burying a wiring layer such as an aluminum alloy film securely into a contact hole having high aspect ratio.

SUMMARY OF THE INVENTION

The invention, in short, is intended to open contact holes having a small opening width in the bottom of a recess of a large opening width by forming this recess in the contact hole forming position of an insulator film in advance before opening the contact holes in the insulator film.

According to the manufacturing method of the present invention, the opening dimension of the recess above the contact holes may be larger, and by decreasing the shadowing effect, the state of covering of the wiring layer on the side wall of the contact holes is improved, so that a decrease of the wiring resistance and an enhancement of reliability of the wiring may be achieved. Moreover, since the contact holes may be opened at a high precision in the bottom of the recesses, it is possible to keep a proper clearance between the contact holes and gate electrodes, even if the semiconductor elements are integrated at a high density, and electric leakage between wiring layers may be effectively prevented.

BRIEF DESCRIPTION OF THE DRAWINGS

FIGS. 1(a) to (j) are process sequential sectional views showing the method of manufacturing a semiconductor device in a first embodiment of the present invention;

DETAILED DESCRIPTION OF THE INVENTION

Figure 1A:
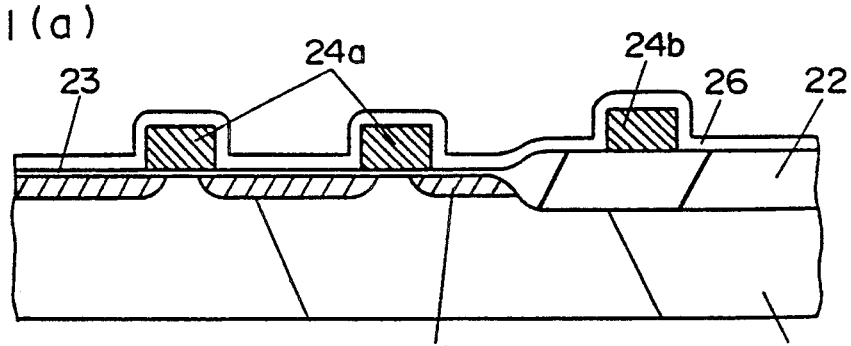

An embodiment of the method manufacturing a semiconductor device of the present invention is described in detail below while referring to the manufacturing process sequential sectional views of a semiconductor device shown in FIGS. 1(a) to (j).

In the first step, a thermal oxide film is formed on one principal plane of a P-type (100) silicon substrate 21, and a nitride film is deposited on the thermal oxide film. Successively, a photoresist is applied, exposed and developed, and window is opened in a region for forming a selective oxide film (LOCOS film) for separation of elements. Using the photoresist as the a mask, the nitride film is etched, and the thermal oxide film is etched and removed, and the surface of the silicon substrate 21 is exposed. Removing this photoresist, the exposed silicon substrate 21 is oxidized in an oxidizing atmosphere, and a selective oxide film 22 of about 500 nm in thickness is formed. Afterwards, the nitride film and thermal oxide film are removed.

Next, heating and oxidizing the surface of the silicon substrate 21 to form, for example, a gate oxide film 23 or 20 nm in thickness, a polycrystalline silicon layer 24a and 24b of 300 to 500 nm in thickness is formed using CVD on the oxide film 23 and the selective oxide film 22 respectively. The polycrystalline silicon layer 24a is used as a gate electrode, and the polycrystalline silicon layer 24b is used as a wiring layer. This polycrystalline silicon is doped with impurities in order to lower the resistance thereof. As the doping method, for example, after forming non-doped polycrystalline silicon, the impurities are implanted by ion implantation, the impurities are diffused from the vapor phase of the impurity gas, or polycrystalline silicon containing impurities is formed simultaneously with the growth by mixing gas containing impurity elements to the gas for growing the polycrystalline silicon using a CVD apparatus for fabricating polycrystalline silicon. Afterwards, under an ordinary photolithography process, using the photoresist having window openings in specified regions as a mask, the polycrystalline silicon is etched, and a polycrystalline silicon gate layer 24a and polycrystalline silicon wiring layer 24b are formed. Ions are then implanted into the entire area of the silicon substrate 21 to form a diffusion region 25. At this time, ions are not implanted into the silicon substrate 21 just beneath the polycrystalline silicon gate layer 24a and the selective oxide film 22 because they serve as masks.

After thus forming the MOS type semiconductor device, an oxide film 26 of 300 nm in thickness is deposited on the entire surface of the silicon substrate 21 by CVD [FIG. 1(a)].

Sequentially, a BPSG film 27 of 500 nm in thickness is deposited on the oxide film 26 using CVD.

This BPSG film 27 is composed of an oxide film having for example, boron a concentration of 3 wt. % and a phosphorus concentration of 5 wt. %.

At this time, when the concentrations of boron and phosphorus increase, the melting temperature of the BPSG film 27 is lowered, so that flow is possible at a low temperature. However, if the boron concentration is too high, the moisture absorption of the BPSG film 27 increases. and the film composition becomes unstable. Or if the phosphorus concentration is too high, the aluminum alloy wiring may corrode.

Considering these points, by properly setting the concentrations of boron and phosphorus, a stable process satisfying the favorable flatness and reliability of the BPSG film 27 will be obtained.

Figure 1B:
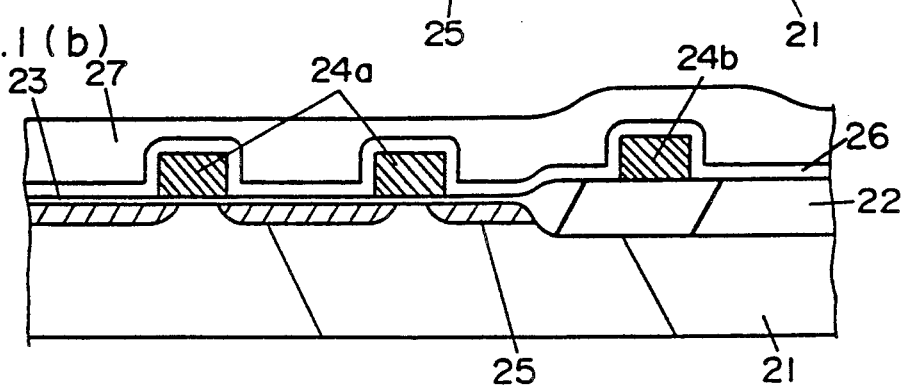

Afterwards, heat treatment is performed in a nitrogen atmosphere for 60 minutes at 900° C., and the BPSG film 27 is caused to flow, thereby flattening the surface of the BPSG film 27 [FIG. 1(b)].

At this time, boron and phosphorus in the BPSG film 27 diffuse in the oxide film 26, but will not penetrate into the silicon substrate 21 because of the oxide film 26 formed on the silicon substrate at the thickness of about 300 nm in the process of FIG. 1(a).

Then, on the BPSG film 27, a photoresist is applied, exposed and developed, and a window is opened at a position to be used as contact of the MOS type semiconductor device.

Using this photoresist pattern (not shown) as the mask, the BPSG film 27 is dry-etched and removed, and the oxide film 26 is dry-etched, and further the gate oxide film 23 is dry-etched, until the silicon substrate 21 is exposed.

In this way, a contact hole 28 is formed.

Dry etching of the BPSG film 27 at this time was conducted by using a parallel flat plate plasma etching apparatus, using gases of $CHF_3$, He, $O_2$ at a volume ratio of 4:15:1, at a total gas flow ratio of 100 cc/min, at an RF electric power of 500 W, for an etching time of 120 seconds.

Figure 1C:
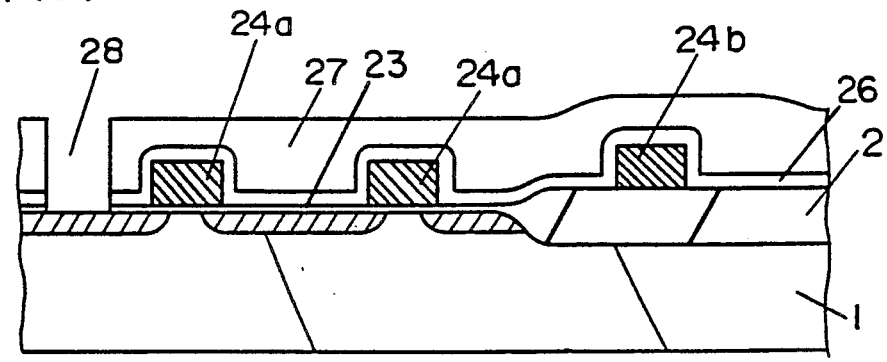

After forming the contact hole 28, the photoresist on the top of the BPSG film 27 is removed [FIG. 1(c)].

The high energy ions generated by this dry etching collide against the silicon substrate 21, and the defects may be formed in the exposed surface region of the silicon substrate 21. However, since the exposed surface of the silicon substrate 21 is washed, and the spontaneous oxide film formed on the exposed surface of the silicon substrate 21 is removed in a subsequent process, the defects in the surface region of the silicon substrate 21 caused by the dry etching are removed.

To remove the spontaneous oxide film, meanwhile, it was etched for about a minute by using a buffered hydrofluoric solution (mixture of hydrogen fluoride and ammonium fluoride) as the etchant.

Subsequently, a polycrystalline silicon film 29a is deposited, using CVD, on the entire surface of the BPSG film 27 at a thickness of, for example, 200 nm, to cover the contact hole 28. This polycrystalline silicon film 29a is doped with impurities, the same as the gate electrode, and, in this case, after growing a non-doped polycrystalline silicon film, heat treatment is conducted for 30 minutes at 900° C. in a gas atmosphere of, for example, $PH_3$ (phospine). As a result, the resistivity of the obtained polycrystalline silicon film 29a is about 50 ohm-cm.

More specifically, the forming conditions of the polycrystalline silicon film 29a include a $SiH_4$ (silane) gas flow rate of 150 cc/min, a growth temperature of 600° C., and a growth time of 50 minutes.

Futheremore, a tungsten silicide (WSix) film 29b is deposited at a thickness of, for example, 200 nm on the surface of the polycrystalline silicon film 29a.

At this time the tungsten silicide film 29a is formed using CVD. The forming conditions include a gas mixing ratio of $WF_6$ (tungsten hexafluoride), $SiH_4$ (silane) of $WF_6/SiH_4 = 1/150$, a total gas flow of 1500 cc/min, a growth temperature of 350° C., and a growth time of 10 minutes.

Then, under the an ordinary photolithography process, using the photoresist having windows opened in specified regions as the mask, the tungsten silicide film 29b and the lower polycrystalline silicon film 29a are etched and removed by reactive ion etching.

The etching conditions of the tungsten silicide film 29b and the polycrystalline silicon film 29a at this time include, using the parallel flat plate plasma etching apparatus, a mixing ratio of $SF_6$ and $C_2Cl_2F$ of 1:1, a total gas flow rate of 50 cc/min, an RF electric power of 100 W, and an etching time of 2 minutes.

Thus is composed a polycide wiring layer 29 comprising the laminate films of polycrystalline silicon film 29a and tungsten silicide film 29b.

Since the polycide wiring layer 29 has a lower wiring resistance as compared with the polycrystalline silicon single layer, the circuit delay caused by the wiring ressitance may be improved.

Figure 1D:
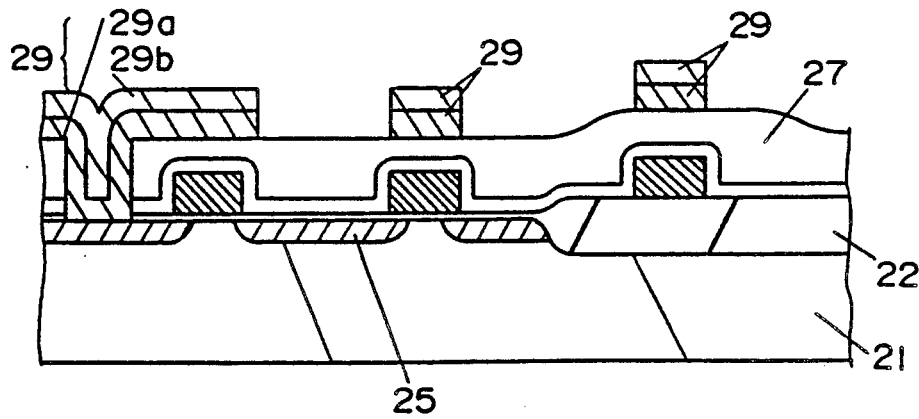

Afterwards, the photoresist is removed [FIG. 1(d)].

In the next step, a BPSG film 30 is deposited on the entire surface of the BPSG film 27 and the polycide wiring layer 29 using CVD. At this time, the impurity concentrations and forming conditions were same as those of the BPSG film 27 shown in FIG. 1(b), but the film thickness was 300 nm because the step difference on the BPSG film 27 before deposition of the BPSG film 30 is smaller than that on the oxide film 26 shown in FIG. 1(b).

Figure 1E:
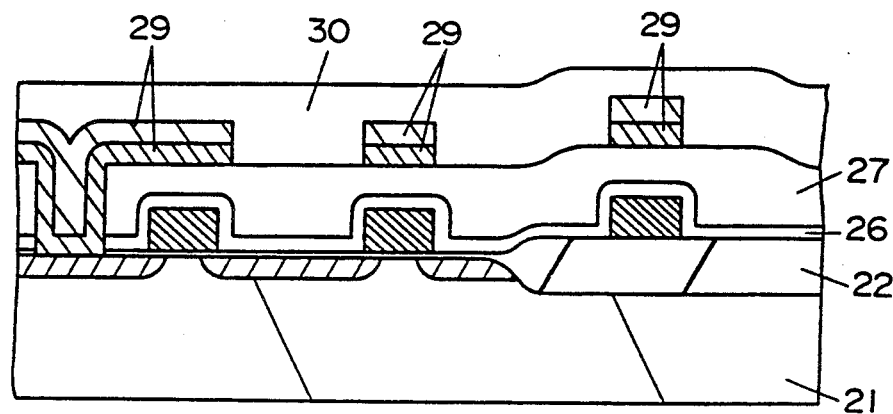

Later, by heat treatment in a nitrogen atmosphere for 60 minutes at 900° C., the BPSG film 30 is caused to flow to thereby flatten its surface [FIG. 1(e)].

On this BPSG film 30, a photoresist 31 is applied, exposed and developed, and a window is opened at the position to be used as the contact of the MOS semiconductor device.

Using this photoresist 31 as the mask, the BPSG film 30 is removed by dry etching, and the BPSG film 27 formed previously in FIG. 1(b) is also dry-etched.

Figure 1F:
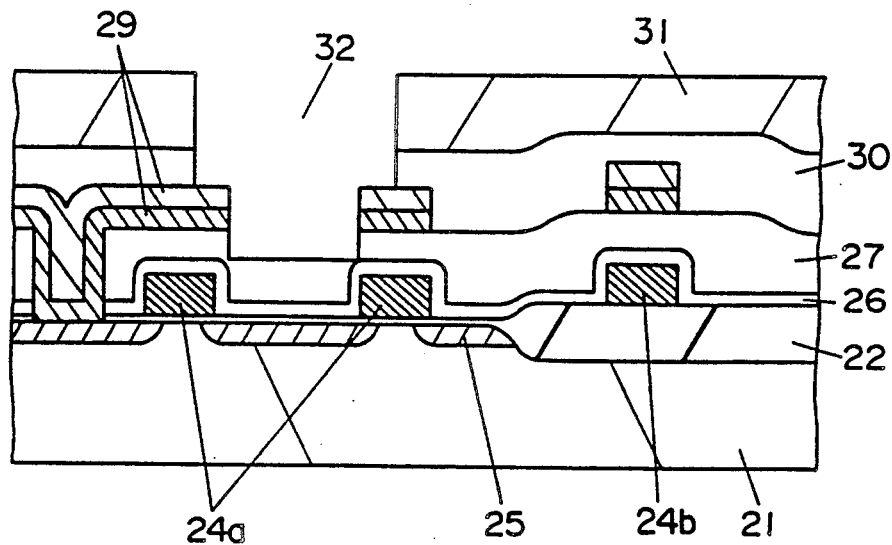

At this time, dry etching is conducted so as to leave the BPSG film 27 by about 300 to 400 nm from the surface of the silicon substrate 21, including the film thickness of the oxide film 26, and a recess 32 is formed [FIG. 1(f)].

The conditions of dry etching of the BPSG film 30 and BPSG film 27 were, using the parallel flat plate type plasma etching apparatus, a gas mixing ratio of $CHF_3$, He, $O_2$ of 4:5:1, a total gas flow rate of 100 cc/min, an RF electric power of 500 W, and an etching time of 40 seconds.

In order to leave the BPSG film 27 from the surface of the silicon substrate by about 300 to 400 nm, the etching time is carefully controlled, and by such careful controlling, the bottom thickness of the recess 32 can be formed at fluctuations of about ±10%.

Thus, the recess 32 can be formed by ordinary dry etching, stably, in a highly reliable process.

Incidentally, if the thickness of the residual film of the BPSG film 27 and oxide film 26 beneath the recess 32 is excessive, the improvement effect of the degree of covering of the step difference of the aluminum alloy to be used as wiring which is formed in a subsequence step is decreased, and hence it is important to employ a stable and highly reliable dry etching process so as to leave a film of an appropriate thickness beneath the recess 32.

Furthermore, the polycide wiring layer 29 runs transverse in the recess 32. Therefore, when an aluminum alloy wiring layer 36 formed on the side wall of the recess 32 in a subsequent process is connected to the polycide wiring layer 29, the side wall of the polycide wiring layer 29 becomes a step difference, and the degree of covering of the step difference of the aluminum alloy wiring layer 36 is impaired. It is accordingly necessary to consider the forming position of the window of resist pattern 31 so that the recess 32 may not be formed in such a region as to envelope the polycide wiring layer 29 completely.

It is, however, all right if the polycide wiring layer 29 is not completely included when the aluminum alloy wiring layer 36 is connected to the diffusion region 25. Therefore, even in a small wiring gap, a recess 32 having a large window width may be formed. The window width of the recess 32 it is preferably about 3 $\mu$m, and if too small, the side wall of the recess 32 becomes steep, and the improvement of the covering of the step difference when the aluminum alloy wiring film is formed in a subsequent process decreases. If it is too large, to the contrary, the polycide wiring layer 29 runs transverse in the recess 32, and the side wall of the polycide wiring layer 29 becomes steep, and hence the covering of the step difference of aluminum alloy wiring layer is also poor. Therefore, at least, it should be about 1.5 $\mu$m, and at most, 5 $\mu$m.

After removing the photoresist 31, a BPSG film 33 is deposited again on the BPSG film 30 and the entire surface of the recess 32 in a thickness of about 400 nm using CVD.

The impurity concentrations of the BPSG film 33 are 4 wt. % of boron and 5 wt. % of phosphorus.

Here, the boron concentration of this BPSG film 33 is higher than that of the previous two BPSG films 27, 30, which is because, as stated above, when the concentrations of boron and phosphorus are increased, the melting temperature of the BPSG film 33 is lowered so as to be able to flow at low temperature. However, if the boron concentration is too high, the moisture absorption of the BPSG film 33 increases, and the composition of the film becomes unstable.

Hence, by setting the concentrations of boron and phosphorus at proper values, a stable process satisfying the favorable flatness and reliability is realized.

In other words, after the etching step, the height from the surface of the BPSG film 27 to the surface of the upper BPSG film 33, that is, the depth of the recess 32 is about 400 to 500 nm, and therefore the boron concentration is increased so that the deposited BPSG film 33 may be favorable in the covering of the step difference, sufficient in flow, and smooth in the shape at the step difference portion.

Meanwhile, the thickness of the BPSG film 33 in this process is determined in consideration that the effect on the improvement of the covering of the step difference of the aluminum alloy film used as the wiring to be formed in a subsequent process may decrease if the thickness of the remaining film in the recess 32 is excessive.

Figure 1G:
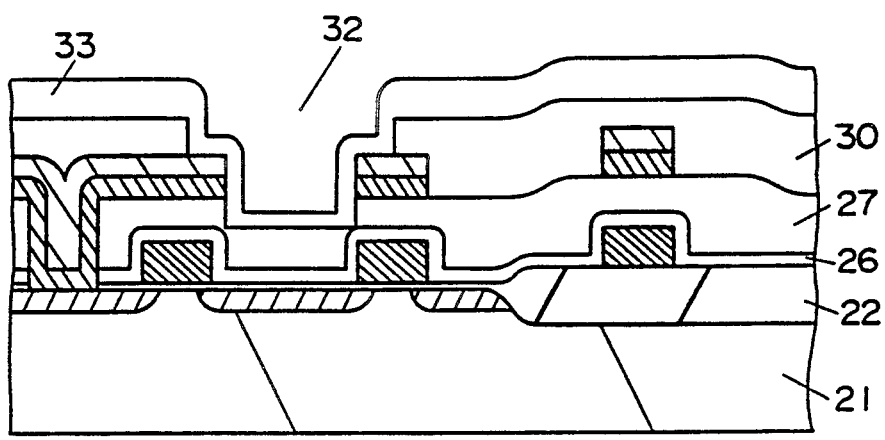

Then, by heat treatment in a nitrogen atmosphere for 60 minutes at 900° C., the BPSG film 33 is caused to flow to thereby flatten the substrate surface [FIG. 1(g)].

By heat treatment, the step difference of the recess 32 and step difference due to the wiring are sufficiently lessened, and breakage of aluminum alloy wiring or formation of bridge (electrical short circuit) in a subsequent process can be prevented.

Or, if the oxide film 26 is not left over in the recess 32 before deposition of the BPSG film 33, by depositing the BPSG film 33, the contact hole may be opened in the next process.

However, if the oxide film 26 and gate oxide film 23 are completely removed, when the BPSG film 33 is directly formed on the silicon substrate 21, impurities may diffuse in the silicon substrate 21 due to heat treatment at the time of flow of the BPSG film 33, and therefore it is not recommended to remove the oxide film 26 or gate oxide film 23 on the recess 32.

Subsequently, on the BPSG film 33, a photoresist 34 is applied, exposed and developed, and a patterned photoresist 34 is formed [FIG. 1(h)].

This photoresist 34 is formed inside the recess 32, and is set so as to be smaller than the opening width of the recess 32 in which the BPSG film 33 is formed, but the same effects will not be obtained only when smaller than the opening width.

Figure 1H:
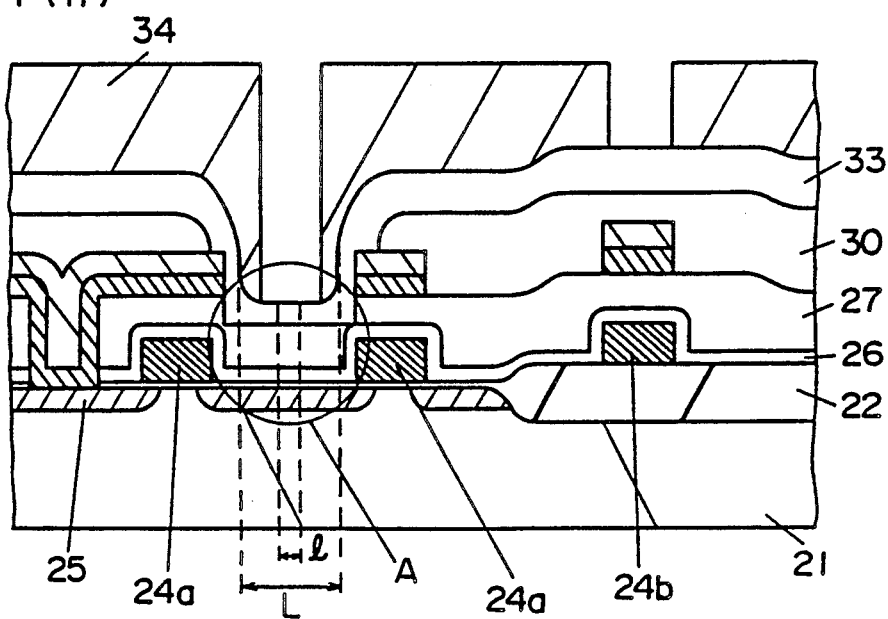
Figure 2:
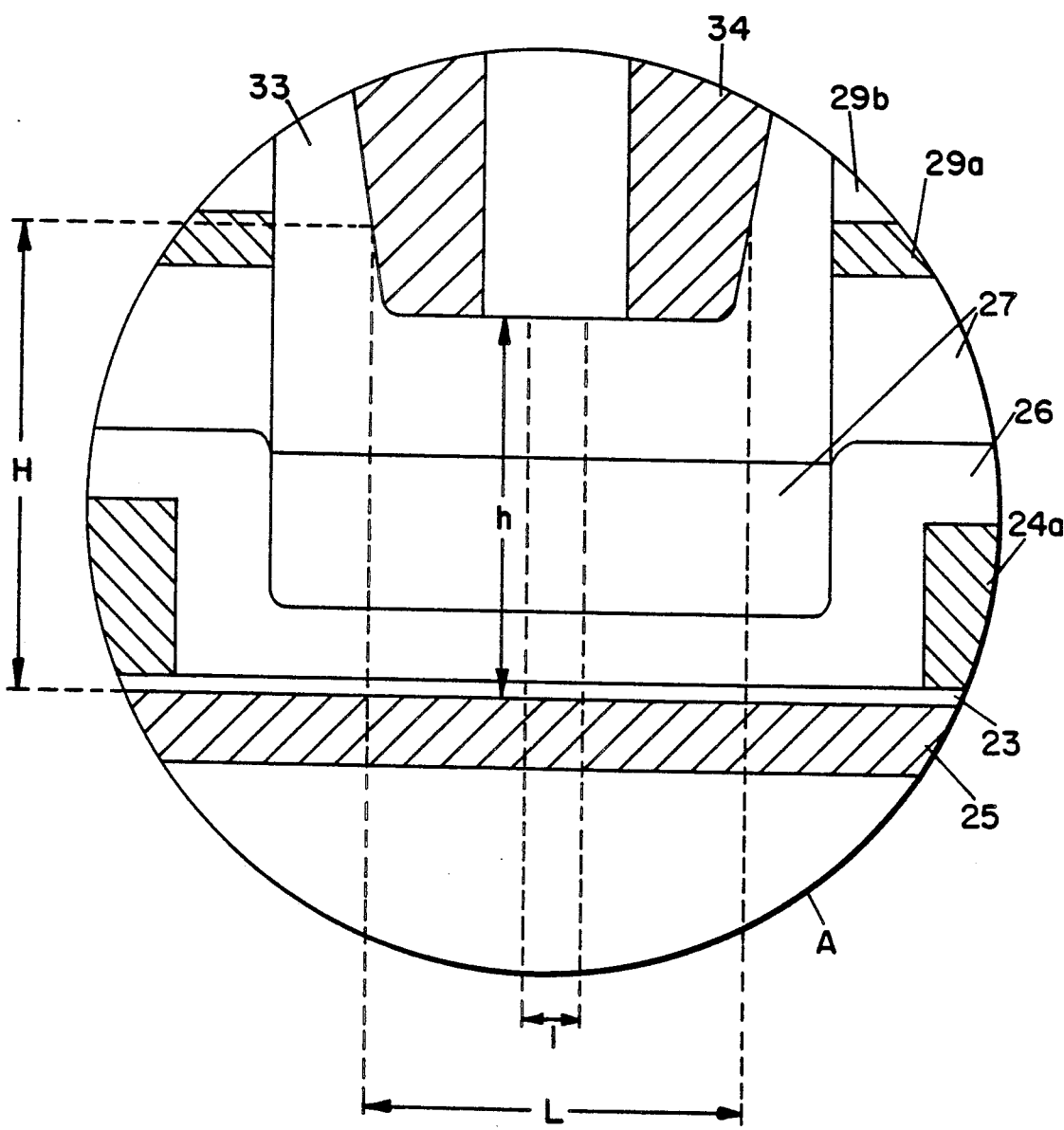
FIG. 2 is an enlarged view of essential parts of FIG. 1(h)

To explain this relation, an enlarged sectional view of the region of circle A in FIG. 1(h) is shown in FIG. 2. In FIG. 2, the symbol "L" denotes the pattern width when the width of the photoresist pattern 34 is broad, "l" is the pattern width when it is narrow, "H" is the height of the side wall of the contact hole when the pattern width is "L", and "h" is the height of the side wall of the contact hole when the pattern width is "l".

If the width of the photoresist pattern 34 on the BPSG film 33 is too broad (width L in FIG. 2), the side wall of the BPSG film 33 may be slightly cut off, and when etched using such a photoresist pattern 34, the actual height of the contact portion will be H. In the present invention, the height from the surface of the silicon substrate 21 to the BPSG film 33 is about 500 nm, and in this example, the height is more than 500 nm, and the covering of the step difference of the aluminum alloy wiring layer in a subsequent process becomes poor. Further, it becomes difficult to maintain an appropriate gap between the contact hole formed by the photoresist pattern 34 and the polycrystalline silicon gate layer 24a, and thereby, the shrinkage of the semiconductor device becomes difficult.

On the other hand, when the pattern width of the photoresist 34 on the BPSG film 33 is too narrow (width "l" in FIG. 2), the photoresist 34 is formed in the flat portion of the bottom of the BPSG film 33, and the height "h" at this time is equal to the height from the surface of the silicon substrate 21 to the BPSG film 33, being about 500 nm. In this example, however, since the pattern width "l" of the photoresist 34 is small, as the value of "l" becomes smaller, the aspect ratio in the contact hole becomes larger, and hence the covering of the step difference of the aluminum alloy wiring layer in a subsequent process is worsened.

Accordingly, it is most effective when the pattern width of the photoresist 34 is, at least, about the thickness of the BPSG film 33, and, at most, equal to the balance of subtracting about twice the thickness of the BPSG film 33 from the width of the recess 32. In other words, if out of this maximum and minimum range, the effect of the present invention may decrease as departing from the individual values.

Next, using the patterned photoresist 34 as the mask, the BPSG film 27, oxide film 26 and gate oxide film 33 remaining in the recess 32 are etched, and a contact hole 35a is formed. At the same time, another portion of the BPSG film 33 and BPSG film 30 is also etched, and a contact hole 35b is formed so that the polycide wiring layer 29 is connected to the aluminum alloy wiring layer formed in a subsequent process [FIG. 1(i)].

As to the contact hole 35b, since the BPSG films 30, 33 formed on the polycide wiring layer 29 is thin, the aspect ratio of the contact hole 35b becomes small.

Finally, an aluminum alloy wiring layer 36 is formed on the entire surface of the BPSG film 33 including the entire surface of the contact holes 35a and 35b. Here, the aluminum alloy wiring layer 36 is formed by sputtering at a deposit thickness of about 0.8 μm. Then, windows are opened in specified regions of the photoresist (not shown) formed on the aluminum alloy wiring layer 36, and the aluminum alloy wiring layer 36 is patterned by means of the photoresist. For such pattern etching, reactive ion etching (RIE) is employed [FIG. 1(j)].

In the semiconductor device composed in the foregoing embodiment, the upper opening width of the contact hole (recess 32) may be set large, it is effective to decrease the shadowing effect caused when covering the aluminum alloy wiring layer 36 (in the case of pattern having a steep side wall with a large aspect ratio, the object deposited from the oblique direction is piled up on the side wall, and not on the intended substrate surface). As a result, the covering of the aluminum alloy wiring layer 36 on the side wall in the opening of the contact hole 35a is notably improved, and the contact resistance is decreased, and a highly reliable aluminum alloy wiring layer 36 may be formed in the contact area.

Moreover, since the bottom of the contact hole 35a can be opened at a high precision, the connection with the aluminum alloy wiring layer 36 may have a secure contact if the width of the contact hole 35a becomes narrow. Moreover, if the semiconductor element is integrated at a high density by the fine pattern, a proper clearance may be maintained between the contact hole 35a and the gate electrode 24, and therefore, electric leakage between wiring layers may be effectively prevented.

The first embodiment is an example of the application of the present invention to a case in which the aluminum alloy wiring layer 36 directly contacts with the diffusion region 25 formed in the silicon substrate 21. By contrast, when connecting the polycide wiring layer 29 formed on the BPSG film 27 of the first layer and the aluminum wiring layer 36 through the contact hole 35b, since the BPSG films 30, 33 on the polycide wiring layer 29 are then, the reliability is generally maintained if the conventional forming method is applied.

However, along with advancements in the of degree of integration of the MOS semiconductor element, the contact hole 35b becomes smaller and the aspect ratio of the contact hole 35b becomes higher, and therefore it becomes difficult to form a wiring having a sufficient step differing covering property, the same as in the prior art shown in FIG. 5.

In order to solve such a problem, the method of the present invention may also be applied to the contact hole 35b for connecting the polycide wiring layer 29 and aluminum alloy wiring layer 36.

Figure 3:
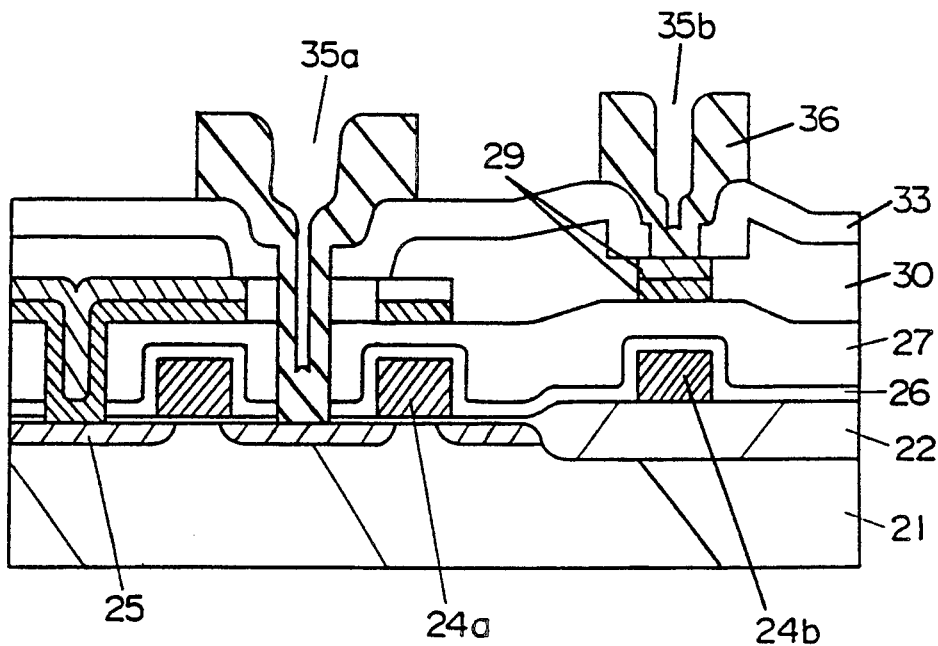
FIG. 3 is a sectional view of a semiconductor device obtained in a second embodiment of the present invention.

As a second embodiment of the invention, FIG. 3 shows a device sectional view in which the aluminum alloy wiring layer 36 is also made to contact the polycide wiring layer 29 by applying the method of the present invention when causing the aluminum alloy wiring layer 36 to contact the diffusion layer shown in FIG. 1.

The same reference numbers as used in FIG. 1 are also used in FIG. 3.

When forming a contact hole on the polycide wiring layer 29 formed on the BPSG film 27 simultaneously on the diffusion layer 25 formed in the silicon substrate 21, as shown in FIG. 1(f), a photoresist 31 is applied, exposed and developed on the BPSG film 30, and windows and opened at the contact position on the MOS semiconductor element that is on the diffusion region 25 and at the contact position on the polycide wiring layer 29, and then using the patterned photoresist 31 as the mask, the BPSG film 30 is removed by dry etching.

At this time, in the embodiment in FIG. 1, the recess 32 was formed by dry-etching so that the BPSG film 27 may be left over by about 300 to 400 nm from the surface of the silicon substrate 21, including the thickness of the oxide film 26. However, in the embodiment in FIG. 3, if the same etching condition is applied, the reliability is impaired because the polycide wiring layer 29 transverses the recess 32. Therefore, the dry etching for forming the recess 32 should be controlled so as to stop on the way before the surface of the polycide wiring layer 29 is exposed in the recess 32.

Afterwards, as shown in FIG. 3, the BPSG film 33 is formed on the entire surface of the BPSG film 30. Then, on the BPSG film 33, the photoresist 34 is formed and patterned as shown in FIG. 1(h), and then, dry etching is effected to form contact holes 35a, 35b in the BPSG film 33, and an aluminum alloy wiring layer 36 is formed thereon.

At this step, however, considering the thickness of the aluminum alloy wiring layer formed in the contact hole 35a, it is necessary to form the recess 32 by dry etching so that the BPSG film may be left over by about 300 to 400 nm from the surface of the silicon substrate 21, including the thickness of the oxide film 26, if the polycide wiring layer 29 is too high above the surface of the silicon substrate 21, it may lead to deterioration of the device because the aluminum alloy wiring layer formed in the contact hole 35a becomes thin. Therefore, the thickness of the oxide film 26 or BPSG film 27 is reduced and the polycide wiring layer 29 is deposed near the silicon substrate 21, or the contact hole width is increased so as to reduce the aspect ratio of the contact hole 35a on the surface of the silicon substrate 21, or the thickness of the BPSG films 30, 33 is selectively increased in the region contacting with the polycide wiring layer 29 of the BPSG film 30 or 33. As a result, a sufficient effect of the present invention is brought about without causing any problems.

Figure 4:
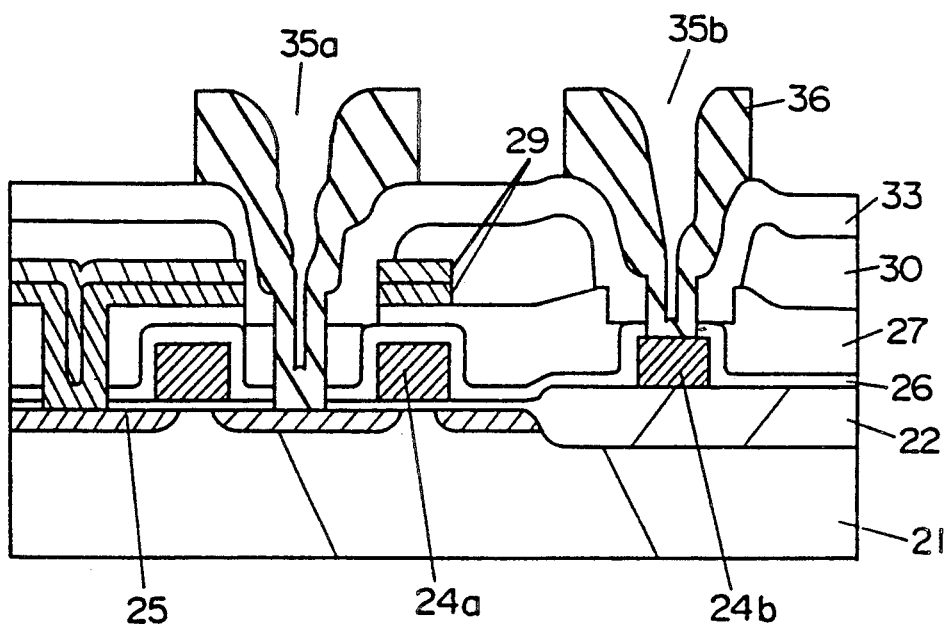
FIG. 4 is a sectional view of a semiconductor device obtained in a third embodiment of the present invention.
Figure 5A:
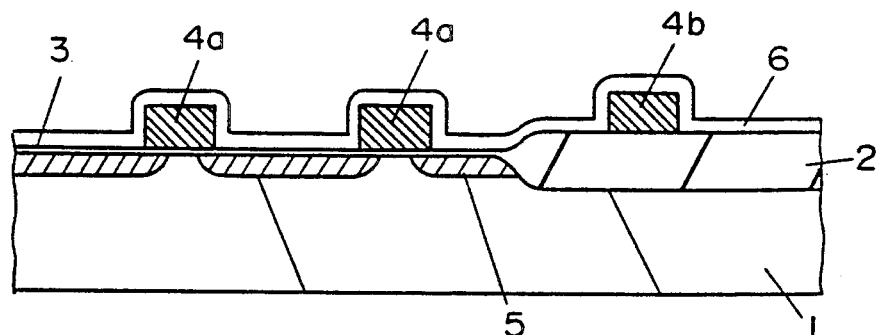
FIGS. 5(a) to (f) are process sequential sectional views showing the a prior art method of manufacturing a semiconductor device.
Figure 5B:
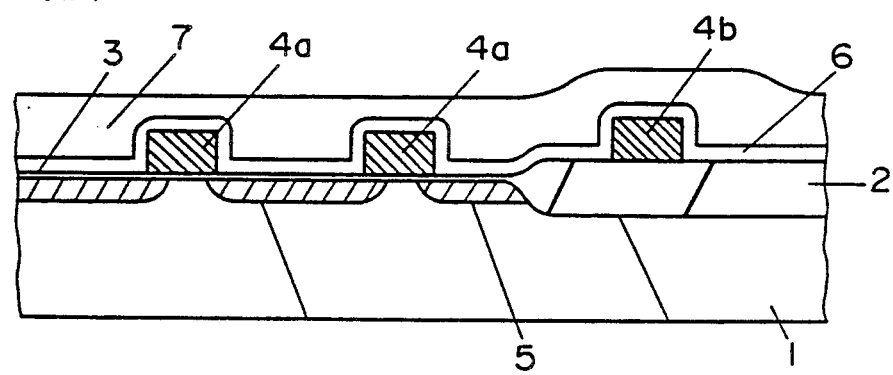
Figure 5C:
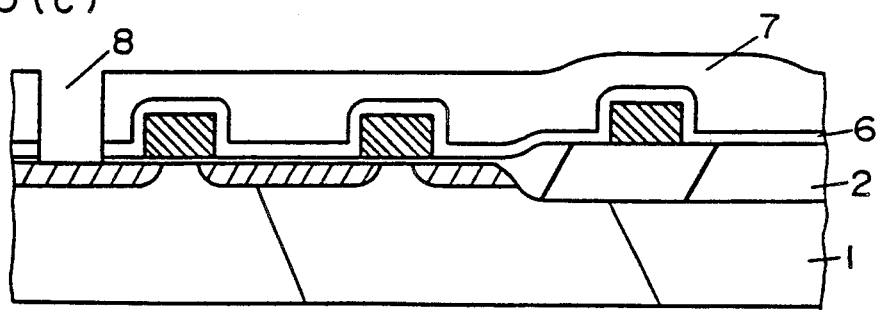
Figure 5D:
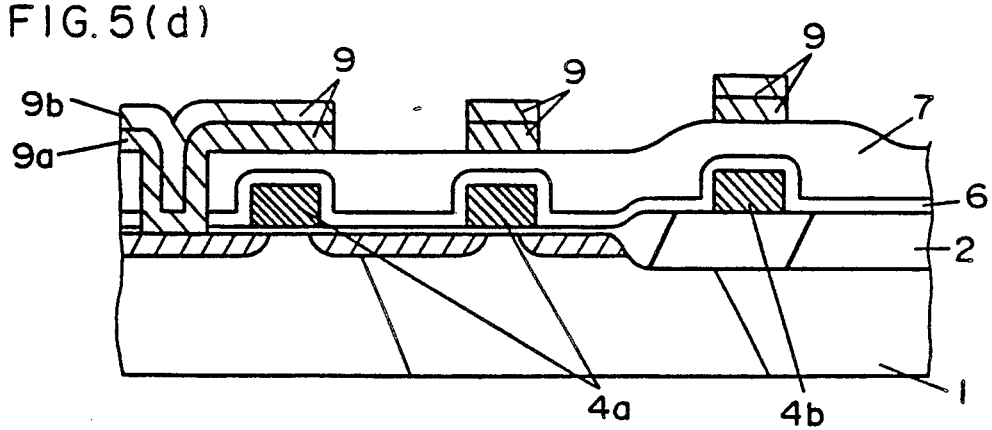
Figure 5E:
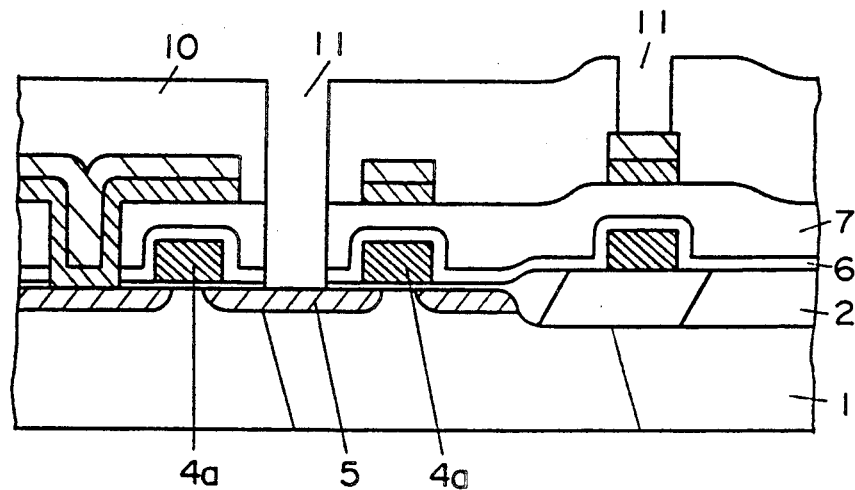
Figure 5F:
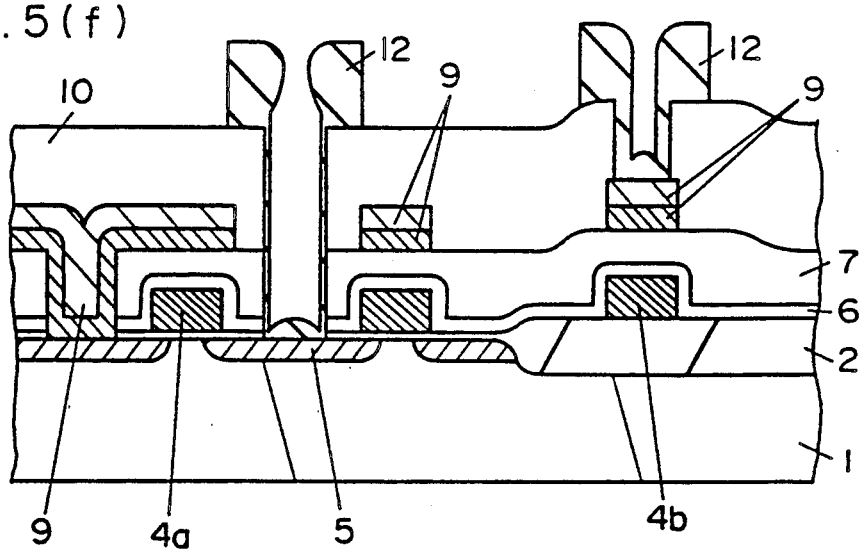

As a third embodiment of the invention, FIG. 4 shows a sectional view of the device in which the aluminum alloy wiring layer 36 is made to contact with polycrystalline silicon gate layers 24a, 24b simultaneously when the aluminum alloy wiring layer 36 is made to contact with the diffusion region 25 formed in the silicon substrate 21 as shown in FIG. 1. In FIG. 4, however, the sectional view of the portion of the contact with the polycrystalline silicon gate layer 24b is shown.

In FIG. 4, the same reference numbers as in FIG. 1 are used.

Here, since the thickness of the polycrystalline silicon gate layers 24a, 24b is about 0.5 $\mu$m at most, therefore the method shown in the first embodiment may be directly applied, and a sufficient effect is obtained.

Meanwhile, in the embodiments in FIG. 3, FIG. 4, as in the embodiment in FIG. 1, it is effective (1) to set the opening width of the recess within a range of 1.5 $\mu$m and 5 $\mu$m, and (2) to set the opening width of the contact hole at about the thickness of the BPSG film 33 as a minimum, and at about the balance of subtracting twice the thickness of the BPSG film 33 from the opening width of the recess as a maximum.

Incidentally, in all embodiments shown in FIG. 1, FIG. 3 and FIG. 4, the interlayer insulator film is not limited to a BPSG film, but an oxide film containing phosphorus (PSG) or oxide film containing arsenic (AsSG) may be used.

The etching process for forming the recesses and contact holes is not limited to the dry etching, and any anisotropic etching may be employed.

In the foregoing description, the contact shape is a hole, but similar effects are obtained if the shape is a groove or the like or the number of wiring layers is two or more.

Further, in the foregoing embodiments, although only one contact hole is formed in the bottom of a recess, it is possible to form two or more contact holes in the bottom of a recess.

As described herein, according to the manufacturing method of the present invention, by providing a large opening dimension of the recess in the upper part of the contact hole, the degree of covering of the wiring layer such as aluminum alloy wiring layer on the side wall of the contact hole portion is improved, and the contact resistance may be decreased and aluminum wiring breakage may be prevented, so that the reliability of the semiconductor device may be enhanced.

We claim:

1. A method of manufacturing a semiconductor device comprising:
   a step of forming a first insulator film on a conductive diffusion region;
   a step of forming a recess in said first insulator film over said conductive diffusion region such that a portion of said first insulator film remains between a bottom of said recess and said conductive diffusion region;
   a step of forming a second insulator film on said first insulator film so as to cover said recess;
   a step of forming a contact hole within the recess such that said contact hole has a smaller opening width than an opening width of said recess and extends from the bottom of said recess to said conductive diffusion region through said first and second insulator films; and
   a step of forming a wiring layer on surfaces of said second insulator film, said recess and said contact hole so as to connect said wiring layer with said conductive diffusion region.

2. A method as recited in claim 1, wherein the opening width of said recess is formed to be in a range of 1.5 $\mu$m to 5 $\mu$m.

3. A method as recited in claim 1, wherein said first and second insulator films are formed of BPSG film.

4. A method as recited in claim 1, wherein the opening width of said contact hole formed at minimum to coincide with a thickness of said second insulator film, and is formed at maximum to coincide with about twice the thickness of said second insulator film subtracted from the opening width of said recess.

5. A method of manufacturing a semiconductor device comprising:
   a step of forming an impurity diffusion region in a semiconductor substrate;
   a step of forming a first insulator film on said semiconductor substrate;
   a step of forming a first wiring layer on said first insulator film;
   a step of forming a second insulator film on said first insulator film and first wiring layer;
   a step of forming a second wiring layer on said second insulator film;
   a step of forming a third insulator film on said second insulator film and second wiring layer;
   a step of forming first and second recesses in said third insulator film above said impurity diffusion region and above said second wiring layer, respectively;
   a step of forming a fourth insulator film on said third insulator film so as to cover said first and second recesses;
   a step of forming a first contact hole within said first recess such that said first contact hole has a smaller opening width than an opening width of said first recess and extends from a bottom of said first recess to said impurity diffusion region through said first, second, third and fourth insulator films;
   a step of forming a second contact hole within said second recess such that said second contact hole has a smaller opening width than an opening width of said second recess and extends from a bottom of said second recess to said second wiring layer through said fourth insulator film; and
   a step of forming third wiring layers on surfaces of said fourth insulator film, said first and second recesses, and said first and second contact holes so as to connect said third wiring layers to said impurity diffusion region and second wiring layer, respectively.

6. A method as recited in claim 5, wherein said first insulator film is formed to have a relatively small thickness, and wherein said first and second contact holes are formed at the same time.

7. A method as recited in claim 5, wherein the opening width of said first contact hole is larger than the opening width of said second contact hole, and wherein said first and second contact holes are formed at the same time.

8. A method as recited in claim 5, wherein the opening width of said first and second recesses is formed to be in a range of 1.5 $\mu$m to 5 $\mu$m.

9. A method as recited in claim 5, wherein said second, third and fourth insulator films are formed of BPSG film.

10. A method as recited in claim 5, wherein the opening width of said first and second contact holes is formed at minimum to coincide with a thickness of said fourth insulator film, and is formed at maximum to coincide with about twice the thickness of said fourth insulator film subtracted from the opening width of said first and second recesses.

11. A method of manufacturing a semiconductor device comprising:
    a step of forming an impurity diffusion region in a semiconductor substrate;
    a step of forming a first insulator film on said semiconductor substrate;
    a step of forming a first wiring layer on said first insulator film;
    a step of forming a second insulator film on said first wiring layer;
    a step of forming a second wiring layer on said second insulator film;
    a step of forming a third insulator film on said second insulator film and second wiring layer;
    a step of forming first and second recesses in said second and third insulator films above said impurity diffusion region and first wiring layer, respectively;
    a step of forming a fourth insulator film on said third insulator film so as to cover said first and second recesses;
    a step of forming a first contact hole within said first recess such that said first contact hole has a smaller opening width than an opening width of said first recess and extends from a bottom of said first recess to said impurity diffusion region through said first, second and fourth insulator films;
    a step of forming a second contact hole within said second recess such that said second contact hole has a smaller opening width than an opening width of said second recess and extends from a bottom of said second recess to said first wiring layer through said second and fourth insulator films; and
    a step of forming third wiring layers on surfaces of said fourth insulator film, said first and second recesses, and said first and second contact holes so as to connect said third wiring layers to said impurity diffusion region and first wiring layer, respectively.

12. A method as recited in claim 11, wherein the opening width of said first and second recesses is formed to be in a range of 1.5 $\mu$m to 5 $\mu$m.

13. A method as recited in claim 11, wherein said second, third and fourth insulator films are formed of BPSG film.

14. A method as recited in claim 11, wherein the opening width of said first and second contact holes is formed at minimum to coincide with about a thickness of said fourth insulator film, and is formed at maximum to coincide with about twice the thickness of said fourth insulator film subtracted from the opening width of said first and second recesses.

* * * * *